United States Patent
Hanna

(10) Patent No.: US 7,162,680 B2
(45) Date of Patent: Jan. 9, 2007

(54) METHOD AND CIRCUIT FOR INTERLACING NUMERIC DATA TO REDUCE TRANSMISSION ERRORS

(75) Inventor: Charaf Hanna, Domene (FR)

(73) Assignee: STMicroelectronics SA, Montrouge (FR)

( * ) Notice: Subject to any disclaimer, the term of this patent is extended or adjusted under 35 U.S.C. 154(b) by 668 days.

(21) Appl. No.: 10/424,166

(22) Filed: Apr. 25, 2003

(65) Prior Publication Data
US 2003/0233605 A1     Dec. 18, 2003

(30) Foreign Application Priority Data
Apr. 26, 2002   (FR) ................... 02 05290

(51) Int. Cl.
*H03M 13/00* (2006.01)
(52) U.S. Cl. .................................... 714/761
(58) Field of Classification Search ............... 714/751, 714/761
See application file for complete search history.

(56) References Cited

U.S. PATENT DOCUMENTS

| | | | | |
|---|---|---|---|---|
| 4,471,485 A | * | 9/1984 | Prevot et al. ............... | 714/751 |
| 4,566,105 A | * | 1/1986 | Oisel et al. ................ | 714/756 |
| 5,764,649 A | * | 6/1998 | Tong ......................... | 714/701 |
| 5,828,671 A | | 10/1998 | Vela et al. ................ | 714/701 |
| 5,978,883 A | | 11/1999 | Hanna ........................ | 711/5 |
| 6,192,493 B1 | | 2/2001 | Combelles et al. ......... | 714/701 |

FOREIGN PATENT DOCUMENTS

| EP | 0608079 | 7/1994 |
|---|---|---|
| WO | 01/50614 | 7/2001 |

OTHER PUBLICATIONS

Patent Abstracts of Japan, vol. 1997, No. 02, Feb. 28, 1997, & JP 08279766A (Nec Corp.), Oct. 22, 1996.

* cited by examiner

*Primary Examiner*—Shelly Chase
(74) *Attorney, Agent, or Firm*—Lisa K. Jorgenson; Allen, Dyer, Doppelt, Milbrath & Gilchrist, P.A.

(57) ABSTRACT

A method for interlacing digital data to reduce transmission errors includes dividing a stream of digital data into consecutive blocks of bits, and interlacing each block of bits by writing to an interlacing table. The interlacing table is arranged in the form of rows and columns of memory addresses, with a number of the rows and columns corresponding to predetermined interlacing parameters. The access sequences to the memory addresses for interlacing the blocks of bits are different from each other. The method further includes reading a block of bits in the interlacing table according to a memory addresses access sequence, and also writing bits to a consecutive block of bits according to the memory addresses access sequence during the reading.

27 Claims, 2 Drawing Sheets

| | Column 0 | Column L | | ... | Column L-1 |
|---|---|---|---|---|---|
| Row 0 | access 0 | access I2 | access 2*I2 | ... | access (L-1)*I2 |
| | access 1 | access I2+1 | access 2*I2+1 | ... | access (L-1)*I2+1 |
| | ... | ... | ... | ... | ... |
| | ... | ... | ... | ... | ... |
| Row I1 | access I1 | access I2+I1 | access 2*I2+I1 | ... | access (L-1)*I2+I1 |
| ... | access I1+1 | access I2+I1+1 | access 2*I2+I1+1 | ... | access (L-1)*I2+I1+1 |
| ... | ... | ... | ... | ... | ... |
| Row I2-1 | access I2-1 | access 2*I2-1 | access 3*I2-1 | ... | access L*I2-1 |

FIG.1
(PRIOR ART)

| | Column 0 | Column L | | Column L-1 |
|---|---|---|---|---|
| Row 0 | Bit 0 | Bit 1 | Bit 2 | ... | Bit L-1 |
| | Bit L | Bit L+1 | Bit L+2 | ... | Bit 2*L-1 |
| Row I | ... | ... | ... | ... | ... |
| | ... | ... | ... | ... | ... |
| Row I-1 | Bit (I-1)*L | Bit (I-1)*L+1 | Bit (I-1)*L+2 | ... | Bit L*I-1 |

| | Column 0 | Column L | | Column L-1 |
|---|---|---|---|---|
| Row 0 | access 0 | access I2 | access 2*I2 | ... | access (L-1)*I2 |
| | access 1 | access I2+1 | access 2*I2+1 | ... | access (L-1)*I2+1 |
| | ... | ... | ... | ... | ... |
| | ... | ... | ... | ... | ... |
| Row I1 | access I1 | access I2+I1 | access 2*I2+I1 | ... | access (L-1)*I2+I1 |
| ... | access I1+1 | access I2+I1+1 | access 2*I2+I1+1 | ... | access (L-1)*I2+I1+1 |
| ... | ... | ... | ... | ... | ... |
| Row I2-1 | access I2-1 | access 2*I2-1 | access 3*I2-1 | ... | access L*I2-1 |

METHOD AND CIRCUIT FOR INTERLACING NUMERIC DATA TO REDUCE TRANSMISSION ERRORS

FIELD OF THE INVENTION

The present invention relates to the field of data transmission, and in particular, to a method and a circuit for interlacing digital data to reduce transmission errors.

BACKGROUND OF THE INVENTION

Interlacing is used to protect data against transmission errors. The general principle of interlacing is to make these transmission errors random. This is done during transmission by dispersing bits, particularly words or bytes, in a transmitted data stream to avoid a large number of bits belonging to the same coding word from being subjected to identical transmission noise. On reception, the bits, particularly the words or bytes, are then resequenced into the order in which they would have been before they were interlaced.

To interlace an incident data stream, the data stream is divided into blocks of bits, and the interlacing itself is done on each of the blocks. To achieve this, the bits, and particularly the words or bytes in each block, are entered into an interlacing table in which the characteristics correspond to predefined interlacing, namely the length of coding words L and the interlacing depth I. The length of the coding words corresponds to the number of bit sets in each row in the interlacing table. The interlacing depth I is a predetermined integer number corresponding to the number of consecutive coding words, and therefore to the number of rows in the interlacing table. The increase in the interlacing depth I increases the efficiency of the interlacing method, namely the protection against transmission noise. However, this increase necessitates the use of an interlacing table with a higher capacity, and consequently, leads to a significant increase in the time taken by the processing necessary for interlacing the data. This type of increase in the data processing time is a major disadvantage in telecommunications.

To interlace an incident data stream, the data stream is divided into blocks, with each block having LxI bit sets. The bits in each data block are written in the form of successive rows of bit sets in the interlacing table, and bit sets for each block are extracted in a different order, for example, column by column.

It frequently occurs that the number of bits in the last processed block is less than the number of memory addresses in the interlacing table, that is, less than Lxi. In this case, the interlacing for the bits in this block is less efficient than the interlacing for the bits in the previous block since they are less dispersed.

To overcome this disadvantage, a dynamic interlacing method has been proposed by which two interlacing depths I1 and I2 are used, and according to which, a number of blocks are interlaced using the first interlacing depth I1, and consecutive blocks are then interlaced using the second interlacing depth I2. This avoids less interlacing being applied for the last block.

According to these techniques for interlacing digital data, two interlacing tables are used for writing and reading two consecutive data blocks. Thus, at any one instant, a first memory is used to write bit sets in block B, while the other memory is used to read the bit sets in the previous block B−1. After processing the bits in block B−1, the first memory is used to read bits in block B, while the other memory is used to write bits in a consecutive block B+1. Thus, these interlacing techniques require the use of high capacity memories, such as memories with a global capacity that is twice the capacity actually necessary to store all bits in each block.

SUMMARY OF THE INVENTION

In view of the foregoing background, an object of the present invention is to overcome the disadvantage of using high capacity memories for interlacing digital data, and to provide a method and circuit for interlacing digital data while reducing the capacity of the memory used.

This and other objects, advantages and features in accordance with the present invention are provided by a method for interlacing digital data to reduce transmission errors in the data, wherein the method comprises the following steps in which a stream of digital data is divided into consecutive blocks of bits, and each block of bits is interlaced by writing the block of bits into an interlacing table arranged in the form of rows and columns of memory addresses in which the number of rows and columns corresponds to predetermined interlacing parameters, and the bits written in the table are read according to a predefined read sequence.

According to one general characteristic of this method, during an access sequence to memory addresses to read the bits in a block, the bits in a block consecutive to the addresses are written, and the access sequences to the memory addresses for interlacing the blocks of bits are different from each other. This considerably reduces the resources necessary for storing bits in each block to the extent that the bits in a block are written into the same addresses as the bits of a block previously written in memory during the same memory scanning sequence.

According to another characteristic of this method, the memory addresses access sequence is produced starting from at least one of the interlacing parameters. In particular, the interlacing parameters are respectively composed of the number of bits or number of sets of bits of coding words formed by the rows of the interlacing table and by the interlacing depth.

According to one embodiment, the addresses Ai of the interlacing table in which the bits or bit sets number i of a block of bits are written during a memory access sequence are defined according to the following equation:

$$Ai = n_b \times L^b$$

in which L denotes the number of bits or bit sets in the coding words, $n_b$ denotes the order number of the memory access sequence, and b denotes the number of the memory access sequence.

Preferably, this method forms a dynamic interlacing method. Two interlacing depths are then used for interlacing blocks of bits such that the number of bits or bit sets in the last block of bits corresponds as closely as possible to the number of memory addresses in the interlacing table.

According to another characteristic of the method, the number of memory addresses in the interlacing table is chosen so that it is equal to the result of a multiplication between the length of coding words and the greatest interlacing depth.

According to one advantageous embodiment in which each access to memory addresses in each memory access sequence is associated with an order number, in the case in which the bits in a block of bits are written in the interlacing table with a depth value greater than the number of coding words in the block, such that excess positions in the interlacing table remain empty, the order numbers of each access sequence for which the positions of the interlacing table are empty are also identified. These access orders are ignored when reading the bits in these locations.

In this case, order numbers (ni) corresponding to an empty location are identified according to the following series I1, I1+I2, I1+2I2, I1+3I2 . . . , LxI2-1, in which I1 and I2 respectively denote two interlacing depths.

Another aspect of the present invention is to provide a circuit for interlacing digital data. The circuit comprises an interlacing table arranged in the form of rows and columns of memory addresses in which the number of rows and columns correspond to predetermined interlacing parameters in which bits of blocks of incident bits are written in sequence. The circuit also comprises addressing means for providing access sequences to memory addresses for writing and reading blocks of bits in the interlacing table.

According to one aspect of this interlacing circuit, the addressing means may comprise means that, during an access sequence to memory addresses to reading bits in a block, cause the writing of bits in a block consecutive to the addresses, and the access sequences to memory addresses for interlacing blocks of bits are different from each other.

The addressing means may further comprise an incremental register and a memory. The register is incremented during each access sequence to memory addresses during each reception of a number of bits or a bit set corresponding to the interlacing depth with a magnitude corresponding to the contents of the memory. The contents of the register are transferred to the memory after reception of a number of bits or a bit set corresponding to the number of memory address in the interlacing table. For example, the addressing means may also comprise an addressing register in which the memory address of the interlacing table currently being accessed is stored, and an adder to add the contents of the memory to the contents of the addressing register.

The addressing means comprises a row counter that is incremented following each reception of a bit or a set of incident bits, and is capable of outputting a pulse after reception of a number of bits or a bit set corresponding to the length of a coding word. A block counter is incremented at the time of each pulse sent by the row counter to output a pulse after reception of a number of rows corresponding to an interlacing depth, and an empty memory address identification pulse when the rows are included between two interlacing depths.

An appropriate column counter that is incremented following each reception of a bit or a set of incident bits may be used to output a pulse after reception of a number of bits or bit sets corresponding to an interlacing depth, and an identification pulse for empty memory addresses when the rows are included between two interlacing depths.

BRIEF DESCRIPTION OF THE DRAWINGS

Other purposes, characteristics and advantages of the invention will become clear after reading the description described below, given simply as a non-limiting example with reference to the attached drawings, in which:

FIG. 1 is a diagram illustrating the structure of an interlacing table used in an interlacing method according to the prior art;

FIG. 2 is a diagram illustrating an interlacing table showing a data interlacing method according to the invention;

DETAILED DESCRIPTION OF THE PREFERRED EMBODIMENTS

Figure 3:
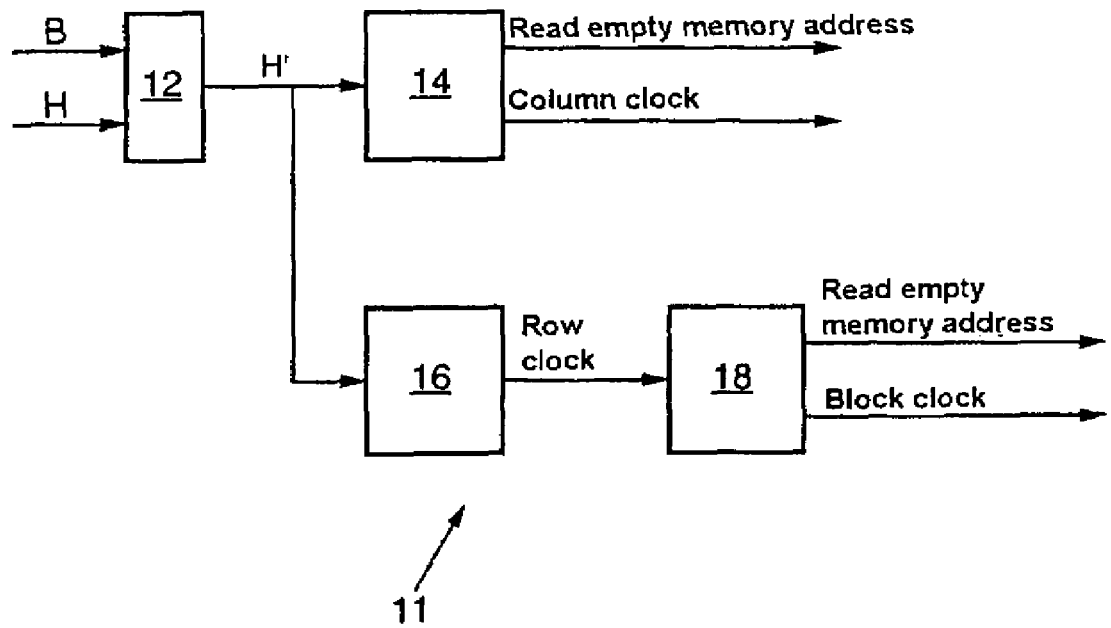
FIG. 3 is a block diagram illustrating an example implementation of part of an interlacing circuit according to the invention.

FIG. 1 shows an interlacing table 10 that will be used in an interlacing method in accordance with the present invention. The interlacing table 10 is arranged in the form of rows and columns of memory addresses. It is intended to be used jointly with an identical interlacing table to interlace blocks of incident bits resulting from the division of a stream of digital data to be processed.

Conventionally, interlacing is done using specific interlacing parameters. L denotes the length of the coding words each formed by a row in the interlacing table, and I denotes the number of coding words used during the interlacing, in other words, the number of rows in the interlacing table. The size of the blocks of bits is related to the product of the magnitudes LxI.

During interlacing, the LxI first bits or bit sets in the incident data stream are written in the interlacing table, such that the first row (or row zero) in the table is filled with the first L bits or words in the first block in the order in which they are received, and similarly, the other rows are filled, in sequence, by bits or words in the first block in their order of arrival. The result is that I coding words of L bits or bit sets each are created.

To do the actual interlacing of the bits in this first block, these bits or bit sets are read according to an access sequence to different memory addresses, for example, column by column. Thus, according to this example, the access sequence to memory addresses for reading bits is as follows: Bit 0, bit L . . . , bit (I–L)xL, bit 1, bit L+1, . . . , bit (I–1)xL+1, . . . , bit L–1, bit 2xL–1, . . . , bit LxI–1. Obviously, in this series, the memory addresses are denoted by the order number of the bits or words that they contain.

As mentioned above, this interlacing table will be used jointly with an identical interlacing table, such that when the bits in a first block are read starting from this table, the bits in a consecutive block are written in the other interlacing table. This technique requires the use of a relatively high capacity memory, such as twice the capacity necessary for storage of all bits in each block.

To overcome this disadvantage, one method of interlacing according to the invention makes use of a single interlacing table. To achieve this, the access sequence to memory addresses for reading the bits in each block is the same as the access sequence to memory addresses for writing each block. These sequences are different for writing and reading all blocks in the incident data stream.

During a single memory scan, the first step is to read the bits stored in the interlacing table. The second step is to write bits in a consecutive bits block. Each memory-scanning phase is done according to an access sequence to specific memory addresses.

Thus, in order to interlace an incident data stream using interlacing parameters L and I corresponding to the length of coding words and the interlacing depth respectively, the access sequence to memory addresses Ai used during scanning memory for reading a block B and for writing a consecutive block B+1 is given by the following equation:

$$Ai = n_b \times L^b \quad (1)$$

in which:

Ai denotes the addresses of the interlacing table in which the bits or words No. i in a bits block B are read, and in which bits No. i of a bits block or consecutive words block B+1 are written;

b denotes the memory scanning number;

$n_b$ denotes the order number of the memory access sequence; and

L denotes the number of bits or bits set of coding words.

A scan number b for access to memory addresses at which bits in a block B will be read and at which bits in a block B+1 will be written is made using the access sequence to the following memory addresses:

$$0, 1 \times L^b, 2 \times L^b, \ldots, (LxI-2) \times L^b, (LxI-1) \times L^b = LxI-1 \quad (2)$$

All these intermediate calculations are done modulo LxI−1. Thus, by using this definition of an access sequence to memory addresses, all memory scans begin at memory address 0. Successive addresses are obtained by incrementing an increment specific to each scan, fixed at $L^b$ for a memory scan number b.

This interlacing technique can also be used if several interlacing depths are used for processing a bit stream. For example, in the case in which two interlacing depths I1 and I2 are used, access sequences to memory addresses are calculated for each block, starting from an interlacing depth which is the greatest depth among I1 or I2, namely I2. Thus, the greatest interlacing depth is used to determine the capacity of the interlacing table to be used, in other words, LxI2 bits.

Thus, according to such a dynamic interlacing method, the first block(s) is/are interlaced using an interlacing depth I1. This type of block is provided with LxI1 bits or bit sets, that is, a number of bits of words less than the capacity of the interlacing table. However, during such interlacing, all LxI2 memory addresses in the interlacing table are accessed, such that the interlacing table comprises a number of empty memory addresses equal to LxI2−LxI1.

As it is designed, and as long as the access sequence to memory addresses in the table for writing a block is defined precisely, equation (1) defined above can be used to identify the order numbers of the sequence during which an empty memory address is accessed, so that these access orders are not used when reading bits in the block. Thus, during the reading phase, only non-empty memory addresses will be read, that is, only LxI1 bits or words will be read and the other memory addresses are ignored.

On the contrary, when a block of bits or words is interlaced using an interlacing depth I2, which is the case for the last blocks, all the memory addresses are written and then read during the same memory access sequence. Empty memory addresses are built up by LxI2−LxI1, the last memory addresses in a memory access sequence.

Furthermore, as mentioned previously, the addresses Ai of the interlacing table at which the bits of two consecutive blocks are written and then read are given by the equation:

$$Ai = n_b \times L^b$$

This generic term may also be written as follows:

$$Ai = (n_{b+1}/L) \times L^{b+1} \quad (3)$$

The result of this is that:

$$N_{b+1} = n_b/L \quad (4)$$

Consequently, the order numbers ($n_b$) of the empty positions that are the most recently accessed LxI2−LxI1 locations are identified as follows:

$$LxI1, LxI1+1, LxI1+2, \ldots, LxI2-1 \quad (5)$$

The access numbers are:

$$I1, I1+1/L, I1+2/L, \ldots, I2-1/L \quad (6)$$

It is important to note than all calculations are carried out modulo LxI2−1, such that LxI2−1=0 or 1/L=I2. Consequently, the access orders $n_{b+1}$ corresponding to empty memory addresses during the access sequence b are given by the following series:

$$I1, I1+I2, I1+2I2, \ldots, LxI2-1 \quad (7)$$

Thus, the order numbers of the access sequence of the corresponding memory scan are ignored during the reading phase of bits in a block for which the memory addresses are empty. FIG. 2 shows an example embodiment in which the order numbers of an access sequence to memory addresses between I1 and LxI2−1 are ignored.

An example of a dynamic interlacing method will now be described for an incident digital data stream using the following interlacing parameters L, I1, I2: L=7; I1=2; I2=3. In this case the data stream is composed of a stream of words comprising 49 words. As mentioned above, the greatest interlacing depth, namely I2, is used to select a memory area to build up an interlacing table. In the example considered, the interlacing table comprises 21 memory addresses, namely addresses 0, 1, 2, . . . , 20.

The data stream is divided into three blocks numbered B1, B2 and B3. Blocks B1 and B2 that will be interlaced using the interlacing depth I1 each have 14 words, and block B3 that will be interlaced using the interlacing depth I2 contains 21 words. Four memory scans are necessary, and these scans are numbered b0, b1, b2, b3. The first memory scan, namely scan b0, is used for writing block B1. In equation (1), the increment for calculating the access sequence to memory addresses is $L^0=1$. The access sequence to memory addresses is then given by the following series: 0, 1, 2, 3, . . . , 20.

Thus, the 14 words in block B1 are written at the first 14 memory addresses, at the following addresses: 0, 1, 2, 3, 4, 5, 6, 7, 8, 9, 10, 11, 12, 13. The LxI2−LxI1 (=7) last memory addresses are empty at the following addresses: 14, 15, 16, 17, 18, 19, 20.

The next scan b1 is used to read block B1 and to write block B2. The increment for this scan is $L^1=7$. The memory address access sequence is then given by the following series: 0, 7, 14, 21 (modulo 20=1), 8, 15, 22 (modulo 20=2), 9, 16, 23 (modulo 20=3), 10, 17, 24 (modulo 20=4), 11, 18, 25 (modulo 20=5), 12, 19, 26 (modulo 20=6), 13, 20.

During the scan of the 21 memory addresses to read words in block B1, the order numbers of the access sequence to memory addresses for which the memory locations are empty are as follows: 2, 5, 8, 11, 14, 17, 20.

These order numbers are ignored during the read phase, and they correspond to the following memory addresses: 14, 15, 16, 17, 18, 19, 20. Thus, the 14 words in block B1 are read starting from the following memory addresses: 0, 7, 1, 8, 2, 9, 3, 10, 4, 11, 5, 12, 6, 13.

Starting from the access sequence to memory addresses used to write block B1, the above-mentioned read sequence actually corresponds to an interlacing depth of 2. With respect to the 14 words in block B2, these 14 words are written at the first 14 memory addresses: 0, 7, 14, 1, 8, 15, 2, 9, 16, 3, 10, 17, 4, 11. The last 7 memory addresses 18, 5, 12, 19, 6, 13, 20 are empty.

The memory scan b2 is used to read block B2 and to write block B3. The increment for this scan is $L^2=49$ (modulo 20=9). The access sequence to memory addresses for this scan is then as follows: 0, 9, 18, 27 (modulo 20=7), 16, 25 (modulo 20=5), 14, 23 (modulo 20=3), 12, 21 (modulo 20=1), 10, 19, 28 (modulo 20=8), 17, 26 (modulo 20=6), 15, 24 (modulo 20=4), 13, 22 (modulo 20=2), 11, 20.

While scanning the 21 memory addresses to read block B2, the order numbers corresponding to an access to an empty memory address are identified: 2, 5, 8, 11, 14, 17, 20. These order numbers correspond to addresses: 18, 5, 12, 19, 6, 13, 20.

These access order numbers and the corresponding addresses are ignored during the read operation. Consequently, the 14 words in block B2 are read starting from the following memory addresses: 0, 9, 7, 16, 14, 3, 1, 10, 8, 17, 15, 4, 2, 11.

Starting from the memory address sequence used to write block B2, it is found that this read corresponds to an interlacing depth equal to 2. Finally, the 21 bits in block B3 are written in the 21 memory addresses: 0, 9, 18, 7, 16, 5, 14, 3, 12, 1, 10, 19, 8, 17, 6, 15, 4, 13, 2, 11, 20. No memory addresses are left empty during this write phase.

The scan b3 is used to read this block B3. In this scan, the increment is $L^3=343$ (modulo 20=3). The access sequence to memory addresses is then as follows: 0, 3, 6, 9, 12, 15, 18, 21 (modulo 20=1), 4, 7, 10, 13, 16, 19, 22 (modulo 20=2), 5, 8, 11, 14, 17, 20.

Since this is the last block, this scan does not contain a write phase. The 21 words in block B3 are then read from the following 21 memory addresses: 0, 3, 6, 9, 12, 15, 18, 1, 4, 7, 10, 13, 16, 19, 2, 5, 8, 11, 14, 17, 20. Starting from the access sequence to the memory addresses used for writing block B3, this read actually corresponds to an interlacing depth of 3.

An interlacing circuit for an embodiment of the interlacing method described above will now be discussed with reference to FIGS. 3 and 4. FIG. 3 shows a first stage in this interlacing circuit denoted with the general numeric reference 11. It is intended for the detection of empty memory addresses and for counting rows and columns in the interlacing table.

This first stage 11 comprises a multiplexer 12 at the input that receives pulses of incident bits or words B and a clock signal H as input. The multiplexer 12 combines these input signals B and H and generates a clock signal H' that corresponds to the pulses of input bits or words when a "write empty memory address location" flag is not set, or to the clock signal H if this flag is set.

The multiplexer 12 is connected to a first column counter 14 that is incremented during each transition of the clock signal H'. It is reset to zero after reception of a number of transitions equal to I2, that is, at the greatest interlacing depth, and is then incremented again until the end of the incident data stream. Thus, this column counter 14 counts from 0 to I2−1. When this counter 14 reaches the value I2−1, it generates a pulse called the "column clock".

Furthermore, when the count value is greater than or equal to the smallest value of the interlacing depth I1 but is less than the greatest interlacing value I2, it generates a signal called the "read empty memory address", which is used to detect empty memory addresses.

Furthermore, the stage 10 comprises a row counter 16 that is incremented on each transition of the clock signal H'. This counter is reset to zero after reception of L transitions. It is then incremented again and thus continues to operate in this way until the last incident bit or word. Consequently, this row counter 16 counts from 0 to L−1. When the counter reaches the value L−1, this counter 16 sends a signal entitled "row clock". The row counter 16 is connected to a block counter 18 that is incremented on each row. It is reset to zero after reception of I2 row clock pulses. It is incremented again and continues to operate until the end of the incident data stream. This block counter 18 then counts from 0 to I2−1. When this counter reaches the value I2−1, it generates a pulse called the "block clock" pulse. When the value of this counter is greater than or equal to I1 or less than I2, it also generates a signal entitled "empty memory address write flag".

A second stage in the interlacing circuit according to the invention will now be described with reference to FIG. 4, denoted by the general numeric reference 20. This second stage 20 uses signals output by the first stage 10 to generate respective memory address access sequences for reading and writing two consecutive blocks.

Figure 4:
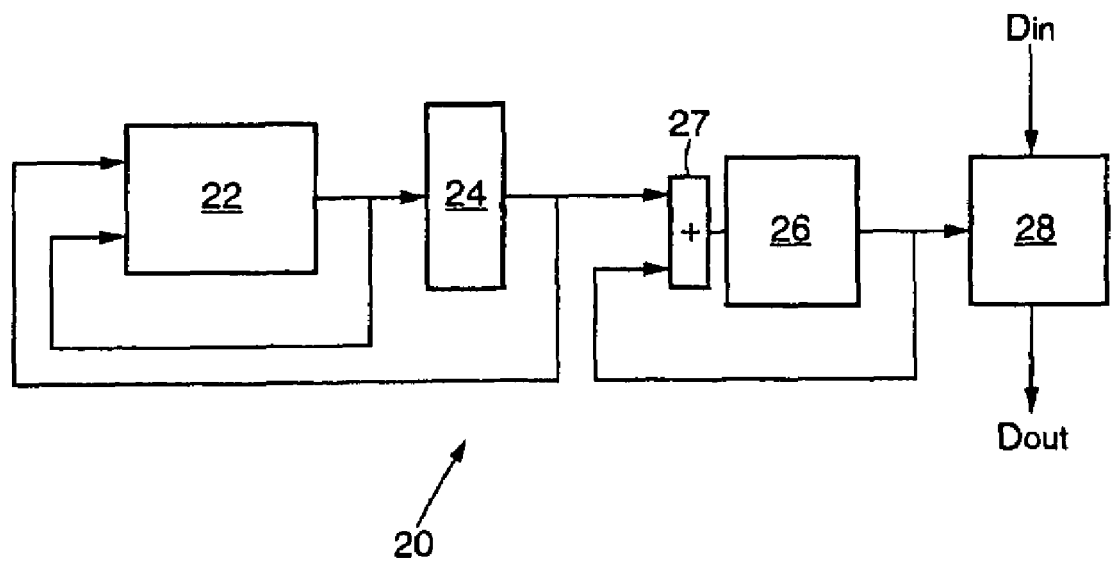
FIG. 4 is a block diagram illustrating an example implementation of a second part of an interlacing circuit according to the invention.

As illustrated in this FIG. 4, this second stage 20 comprises an incremental register 22 that is used to generate an increment value for each memory scan. Referring to the example mentioned above, the content of this register during the first scan is equal to 1. It is incremented during each column clock pulse output by the column counter 14 (FIG. 3) by a value stored in a memory or register 24. Thus, during reception of all bits, namely the words or bytes in the first block, this incremental register 22 is incremented L times. Thus, its value at the end of the first block is equal to L. This value is then transferred into the memory 24 so that it can be used during the next scan.

The incremental register 22 is incremented L times during reception of all bits in the block, and its value at the end of the second bits block is equal to $L^2$. This value is subsequently stored in the memory 24 so that it can be used during the next scan.

The memory 24 is connected to a memory address register 26 used to generate the access sequence to memory data for each scan of the interlacing table. An adder 27 is provided to add the contents of memory 24 to the contents of the addressing register. At the beginning of each sequence, this register 26 receives the value 0. It is then incremented in each clock pulse H' by a value corresponding to the contents of the memory 24, and thus outputs the addresses of each access sequence to memory addresses, which is supplied to the interlacing table 28. The capacity of this interlacing table is L×I2 memory addresses. It receives data $D_{in}$ in each block of incident bits or words as input, and produces interlaced data $D_{out}$ as output.

During each scan of the interlacing table, the bits, namely the words or bytes stored in addresses output by the address register 26 at the addresses corresponding to the equation (1), are read and supplied at the output, whereas the incident bits or words $D_{in}$ are respectively written at these addresses. Nevertheless, when an empty memory address write flag is set during a write cycle, the corresponding addresses are not written. Similarly, when the empty memory addresses read flag is set during this cycle, the read bit or word is ignored.

That which is claimed is:

1. A method for interlacing digital data to reduce transmission errors, the method comprising:
    dividing a stream of digital data into consecutive blocks of bits;

interlacing each block of bits by writing to an interlacing table arranged in the form of rows and columns of memory addresses, with a number of the rows and columns corresponding to predetermined interlacing parameters; and reading a block of bits in the interlacing table according to a memory addresses access sequence, and also writing bits to a consecutive block of bits according to the memory addresses access sequence during the reading, the access sequences to the memory addresses for interlacing the blocks of bits are different from each other, and the access sequences to read the block of bits and to write the consecutive block of bits are different from the access sequences to read and write other blocks of bits.

2. A method according to claim 1, wherein the memory addresses access sequence is produced starting from at least one of the interlacing parameters.

3. A method according to claim 2, wherein the interlacing parameters comprise at least one of a plurality of bits of coding words formed by the rows of the interlacing table, and by a plurality of sets of bits of coding words formed by an interlacing depth.

4. A method according to claim 3, wherein the memory addresses (Ai) in the interlacing table in which the bits or bit sets (number I) of a block of bits are written during a memory access sequence are defined according to the following equation:

$$Ai = n_b \times L^b$$

in which:

L denotes a number of bits or bit sets in the coding words;

$n_b$ denotes an order number of the memory access sequence; and b denotes a number of the memory access sequence.

5. A method according to claim 4, wherein two interlacing depths are used for interlacing blocks of bits such that the number of bits or bit sets in a last block of bits corresponds to a number of memory addresses in the interlacing table.

6. A method according to claim 5, wherein the number of memory addresses in the interlacing table is chosen so that it is equal to a result of a multiplication between a length of coding words and the largest interlacing depth.

7. A method according to claim 6, wherein each access to memory addresses in each access sequence is associated with an order number, and when the bits in a block of bits are written in the interlacing table with a depth greater than the number of coding words in the block, such that excess positions in the interlacing table remain empty, the order numbers of each access sequence for which the positions in the interlacing table are empty are also identified, and these access orders are ignored when reading the bits in these locations.

8. A method according to claim 7, wherein the order numbers corresponding to an empty location are identified according to the following series: I1, I1+I2, I1+2I2, I1+3I2 . . . , L×I2−1, in which I1 and I2 respectively denote two interlacing depths.

9. A method for reducing transmission errors in a digital data stream, the method comprising:

dividing the stream of digital data into consecutive blocks of bits;

interlacing the blocks of bits by writing to an interlacing table arranged in the form of rows and columns of memory addresses, with a number of the rows and columns corresponding to predetermined interlacing parameters;

generating a memory addresses access sequence starting from at least one of the interlacing parameters; and reading a block of bits in the interlacing table according to the memory addresses access sequence, and also writing bits to a consecutive block of bits according to the memory addresses access sequence during the reading, the access sequences to the memory addresses for interlacing the blocks of bits are different from each other, and the access sequences to read the block of bits and to write the consecutive block of bits are different from the access sequences to read and write other blocks of bits.

10. A method according to claim 9, wherein the interlacing parameters comprise at least one of a plurality of bits of coding words formed by the rows of the interlacing table, and a plurality of sets of bits of coding words formed by an interlacing depth.

11. A method according to claim 10, wherein the addresses (Ai) of the interlacing table in which the bits or bit sets (number I) of a block of bits are written during a memory access sequence are defined according to the following equation:

$$Ai = n_b \times L^b$$

in which:

L denotes a number of bits or bit sets in the coding words;

$n_b$ denotes an order number of the memory access sequence; and b denotes a number of the memory access sequence.

12. A method according to claim 11, wherein two interlacing depths are used for interlacing blocks of bits such that the number of bits or bit sets in a last block of bits corresponds to a number of memory addresses in the interlacing table.

13. A method according to claim 12, wherein the number of memory addresses in the interlacing table is chosen so that it is equal to a result of a multiplication between a length of coding words and a largest interlacing depth.

14. A method according to claim 12, wherein each access to memory addresses in each access sequence is associated with an order number, and when the bits in a block of bits are written in the interlacing table with a depth greater than the number of coding words in the block, such that excess positions in the interlacing table remain empty, the order numbers of each access sequence for which the positions in the interlacing table are empty are also identified, and these access orders are ignored when reading the bits in these locations.

15. A method according to claim 14, wherein the order numbers corresponding to an empty location are identified according to the following series: I1, I1+I2, I1+2I2, I1+3I2 . . . , L×I2−1, in which I1 and I2 respectively denote two interlacing depths.

16. A circuit for interlacing digital data comprising:

a memory for storing an interlacing table arranged in the form of rows and columns of memory addresses, with a number of the rows and columns corresponding to predetermined interlacing parameters; and addressing means for providing access sequences to memory addresses for writing and reading blocks of bits in the interlacing table, said addressing means for reading a block of bits in the interlacing table according to a memory addresses access sequence and for also writing bits to a consecutive block of bits according to the memory addresses access sequence during the reading, and the access sequences to the memory addresses for interlacing the blocks of bits are different from each other.

17. A circuit according to claim 16, wherein blocks of incident bits are written and read in sequence.

18. A circuit according to claim 16, wherein said addressing means comprise an incremental register and a second memory connected thereto, said incremental register being incremented during each access sequence to memory addresses during each reception of a plurality of bits or a bit set corresponding to an interlacing depth with a magnitude corresponding to contents of said second memory, and contents of said incremental register being transferred to said second memory after reception of a plurality of bits or of a bit set corresponding to the plurality of memory addresses in the interlacing table.

19. A circuit according to claim 18, wherein said addressing means further comprises:
 an address register in which the memory address of the interlacing table currently being accessed is stored; and
 an adder connected to said address register and to said second memory for adding the contents of said second memory to the contents of said addressing register.

20. A circuit according to claim 18, further comprising:
 a row counter that is incremented following each reception of a bit or of a set of incident bits, and outputs a pulse after reception of a plurality of bits or a bit set corresponding to the length of a coding word; and
 a block counter that is incremented at the time of each pulse sent by said row counter to output a pulse after reception of a plurality of rows corresponding to an interlacing depth and an empty memory address identification pulse when the rows are included between two interlacing depths.

21. A circuit according to claim 20, further comprising a column counter that is incremented following each reception of a bit or of a set of incident bits to output a pulse after reception of a number of bits or bit sets corresponding to an interlacing depth and an empty memory addresses identification pulse when the rows are included between two interlacing depths.

22. A circuit for interlacing digital data comprising:
 a memory for storing an interlacing table arranged in the form of rows and columns of memory addresses, with a number of the rows and columns corresponding to predetermined interlacing parameters; and
 an addressing circuit for providing access sequences to memory addresses for writing and reading blocks of bits in the interlacing table, said addressing circuit for reading a block of bits in the interlacing table according to a memory addresses access sequence and for also writing bits to a consecutive block of bits according to the memory addresses access sequence during the reading, the access sequences to the memory addresses for interlacing the blocks of bits are different from each other.

23. A circuit according to claim 22, wherein the incident bits are written and read in sequence.

24. A circuit according to claim 22, wherein said addressing circuit comprise an incremental register and a second memory connected thereto, said incremental register being incremented during each access sequence to memory addresses during each reception of a plurality of bits or of a bit set corresponding to an interlacing depth with a magnitude corresponding to contents of said second memory, contents of said incremental register being transferred to said second memory after reception of a plurality of bits or of a bit set corresponding to the plurality of memory address in the interlacing table.

25. A circuit according to claim 24, wherein said addressing circuit further comprises:
 an address register in which the memory address of the interlacing table currently being accessed is stored; and
 an adder connected to said address register and said second memory for adding the contents of said second memory to the contents of said addressing register.

26. A circuit according to claim 24, further comprising:
 a row counter that is incremented following each reception of a bit or a set of incident bits, and outputs a pulse after reception of a plurality of bits or of a bit set corresponding to the length of a coding word; and
 a block counter that is incremented at the time of each pulse sent by said row counter to output a pulse after reception of a number of rows corresponding to an interlacing depth and an empty memory address identification pulse when the rows are included between two interlacing depths.

27. A circuit according to claim 26, further comprising a column counter that is incremented following each reception of a bit or of a set of incident bits to output a pulse after reception of a number of bits or bit sets corresponding to an interlacing depth and an empty memory addresses identification pulse when the rows are included between two interlacing depths.

* * * * *